United States Patent [19]

Yamada

[11] Patent Number: 4,937,753

[45] Date of Patent: Jun. 26, 1990

[54] ROUTE END NODE SERIES PREPARING SYSTEM OF NAVIGATION APPARATUS

[75] Inventor: Takashi Yamada, Anjo, Japan

[73] Assignees: Aisin AW Co., Ltd., Anjo; Kabushiki Kaisha Shinsangyokaihatsu, Tokyo, both of Japan

[21] Appl. No.: 290,206

[22] Filed: Dec. 27, 1988

[30] Foreign Application Priority Data

Dec. 28, 1987 [JP] Japan .................................. 62-333040

[51] Int. Cl.⁵ .............................................. G06F 15/50
[52] U.S. Cl. .................................... 364/449; 340/990; 340/995
[58] Field of Search ........................ 364/443, 444, 449; 73/178 R; 340/988, 990, 995

[56] References Cited

U.S. PATENT DOCUMENTS

| | | | |
|---|---|---|---|
| 4,570,227 | 2/1986 | Tachi et al. | 364/444 |
| 4,763,270 | 8/1988 | Itoh et al. | 364/449 |
| 4,782,447 | 11/1988 | Ueno et al. | 364/449 |
| 4,792,907 | 12/1988 | Ikeda et al. | 364/443 |
| 4,796,189 | 1/1989 | Nakayama et al. | 364/449 |

Primary Examiner—Gary Chin
Attorney, Agent, or Firm—Vardell, Legal Group

[57] ABSTRACT

Disclosed is a system for preparing a route end node series which is equipped with a route search means 7 for preparing a node series, an intersection series or a combination of both as the data series for navigation, and a route end node series preparing means 3 for preparing the node series from the starting point and the destination to the respective nearest particular points. The route end node series preparing means 3 prepares node series by successively performing node search until the node nearest to the point indicated by the positional information on the starting point or the destination is attained. This construction makes it possible to perform course guidance through navigation based upon the node series between the starting point or the destination and the nearest intersection thereto even if the starting point or the destination is set at a point between intersections when particular points are set as intersections.

4 Claims, 11 Drawing Sheets

| INTERSECTION NO. | INTERSECTION NAME | SMALLEST OF ROAD NUMBERS DESIGNATING ROADS STARTING FROM CORRESPONDING INTERSECTION | SMALLEST OF ROAD NUMBERS DESIGNATING ROADS TERMINATING AT CORRESPONDING INTERSECTION | EXISTENCE OF TRAFFIC SIGNAL |
|---|---|---|---|---|
| I | KANDA | 1 | 2 | YES |
| II | YUSHIMA | 2 | 1 | YES |
| III | — | 4 | 3 | NO |
| IV | — | 6 | 5 | |

FIG. 2(c)

| ROAD NO. | STARTING POINT | TERMINAL POINT | SECOND OF ROAD NUMBERS DESIGNATING ROADS HAVING SAME STARTING POINT | SECOND OF ROAD NUMBERS DESIGNATING ROADS HAVING SAME TERMINAL POINT | WIDTH OF ROAD | PROHIBITION ① | PROHIBITION ② | NO NEED FOR GUIDANCE | PHOTOGRAPH NO. | NUMBER OF NODES | TOP ADDRESS OF NODE SERIES DATA | LENGTH |
|---|---|---|---|---|---|---|---|---|---|---|---|---|
| 1 | I | II | 7 | 4 | 1 | — | — | 3 | 1 | 15 | 100 | |
| 2 | II | I | 3 | 8 | 1 | — | — | 7 | 2 | 13 | 200 | |
| 3 | II | III | 2 | 3 | 2 | — | — | 5 | 3 | 9 | 300 | |
| 4 | III | II | 5 | 6 | 2 | — | — | 2 | 4 | 20 | 500 | |
| 5 | III | IV | 4 | 7 | 2 | 6 | — | 8 | 5 | 25 | 600 | |
| 6 | IV | II | 8 | 1 | 1 | 3 | 2 | — | 6 | 30 | 700 | |
| 7 | I | IV | 1 | 5 | 0 | — | — | — | 7 | 9 | 800 | |
| 8 | IV | I | 6 | 2 | 0 | — | — | 1 | 8 | 3 | 900 | |

FIG. 2(d)

| ADDRESS | EAST LONGITUDE | NORTH LATITUDE | ATTRIBUTE |
|---|---|---|---|
| | 135.5 | 35.1 | 01 |
| | 135.6 | 35.2 | 01 |
| 100 | | | |
| 200 | | | |

| INTERSECTION NAME |
|---|
| INTERSECTION NUMBER |
| PHOTOGRAPH NUMBER |
| ANGLE |
| DISTANCE |
| INTERSECTION NAME |

(b)

| EAST LONGITUDE |
|---|
| NORTH LATITUDE |
| INTERSECTION NUMBER |
| ATTRIBUTE |
| ANGLE |
| DISTANCE |
| EAST LONGITUDE |

| DESTI-NATION | CONNECTING INTERSECTION ① | CONNECTING INTERSECTION ② | EAST LONGITUDE | NORTH LATITUDE |
|---|---|---|---|---|
| A | I | II | 135 | 35 |
| ⋮ | ⋮ | ⋮ | ⋮ | ⋮ |

(c)

(d)

| DESTI-NATION | CONNECTING INTERSECTION ① | CONNECTING INTERSECTION ② | DISTANCE FROM CONNECTING INTERSECTION ① |
|---|---|---|---|
| A | I | II | 50 |
| ⋮ | ⋮ | ⋮ | ⋮ |

ROUTE END NODE SERIES PREPARING SYSTEM OF NAVIGATION APPARATUS

BACKGROUND OF THE INVENTION

This invention relates to a route searching system of a navigation apparatus used for finding the shortest route from a given point to a destination, and, in particular, to a system of preparing a node series leading to a connecting intersection when a starting point and a destination are set between intersections.

Navigation apparatus are known which guide a driver who is not familiar with a particular region to his destination in that region by selecting a suitable course leading thereto. Apparatus of this kind are now being developed eagerly.

In a conventional navigation apparatus, a course along which a driver will be led to his destination is set based upon a starting point and a destination point which are input before the driver starts traveling. The driver navigates along the set course. There are various systems of designating a desired course during navigation. In one such system a map is displayed on a CRT screen and an image of the course is superposed on the map. In another system information about an intersection where the driver needs to turn the vehicle in accordance with a predetermined course is displayed, which information includes numerals or a graph indicating the distance remaining until the intersection is reached and a picture showing certain features of the intersection. Another system makes use of speech output as an auxiliary means.

Figure 11:
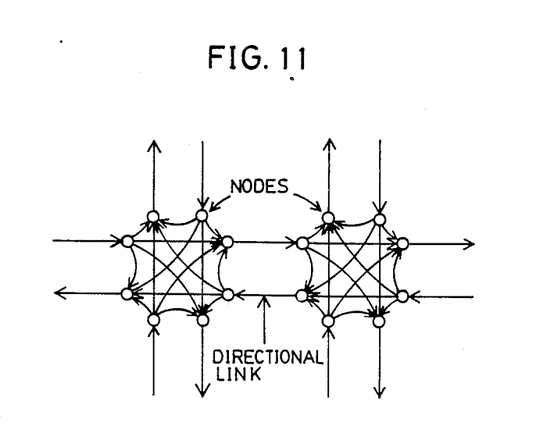
FIG. 11 is a diagram of intersection information constituted by nodes and diectional links, illustrating a conventional route search method.

Ordinarily, in a road system, a plurality of courses which connect a starting point and a destination point could in theory be selected. For this reason, various methods of searching for a shortest-time or shortest-distance course (shortest course) between a desired starting point and destination point have been proposed for application to navigation apparatus. One example of such a method has been reported in which an intersection, such as that shown in FIG. 11, is represented by eight nodes and sixteen directional links to express left and right turns, straight-ahead travel and U-turns, and in which each of the roads connecting the intersections are represented by a pair of directional links. In another example (such as the one disclosed in Japanese Patent Laid-Open No. 62-91811), the shortest course is found by comparing data on courses along on which travel is prohibited, and if travel is prohibited, the course is removed thereby finding a shortest courses where includes no impassable section is to be found.

Generally speaking, when inputting starting points and destinations in such a navigataion apparatus, the points to be inputted are limited to intersections and some particular points which are specified. Accordingly, the driver must move the vehicle to such a specified point and then input the point as the starting point before he can be guided through navigation.

As described above, it is not possible with conventional navigation apparatus to set points other than intersections and some particular points as the starting point or destination. Consequently, a driver who is at a position which does not include such specified points needs to move to the nearest guidable point, such as an intersection, by himself without any guidance.

SUMMARY OF THE INVENTION

It is accordingly an object of this invention to enable a driver who is at a point other than predetermined points, such as intersections, to be guided through navigation. Another object of this invention is to make it possible to freely select a starting point and a destination when deciding on a course of travel. Still aonother object of this invention is to provide a system for preparing a node series from the starting point and the destination input to the respective nearest intersections.

In accordance with this invention, there is provided a system for preparing a node series of a navigation apparatus which can be used in a route search system and which is equipped with node data composed of positional information and attribute information on the roads concerned, intersection data composed of information regarding intersections, and road data composed of information regarding inter-road connection and road characteristics. In the present invention a course for navigation from a starting point to a destination can be set based on a node series, an intersection series, or a combination of a node series and an intersection series. The system of the present invention comprises route searching means for preparing a node series, an intersection series, or a combination of the two as a data for navigation, and route end node series preparing means for preparing a sequence of nodes leading from a starting point and a destination to the respective nearest particular points. The route end node series preparing means prepares the sequence of nodes by successively performing node searching from the nearest particular point until the node which is nearest to the point indicated by the positional information concerning the starting point or the destination is attained.

In a system with the above construction, node searching is successively performed from the nearest particular point to the node which is nearest to the position indicated by the positional information corresponding to a starting point or a destination, so that when a particular point is set as an intersection, course guidance through navigation can be performed by means of the sequence of nodes between the starting point and the nearest intersection thereto and the sequence of nodes between the destination and the nearest intersection thereto, even when the starting point and the destination are set between intersections. Accordingly, the driver can set the starting point or the destination at any point even when he does not know the route leading to the nearest intersection.

Still other objects and advantages of the present invention will in part be obvious and will in part be apparent from the specification.

The invention accordingly comprises the features of construction, combinations of elements, and arrangement of parts which will be exemplified in the descriptions hereinafter set forth, and the scope of the invention will be indicated in the claims.

DESCRIPTION OF THE PREFERRED EMBODIMENTS

An embodiment of the present invention will be described below with reference to the accompanying drawings.

Figure 1:
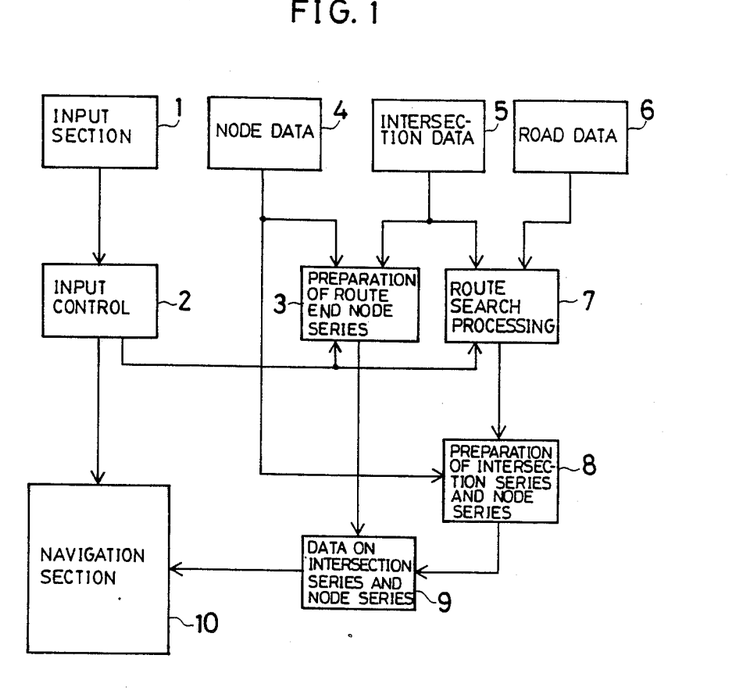
FIG. 1 is a block diagram of a node series preparing system of a navigation apparatus which represents an embodiment of the present invention.

Referring to FIG. 1, a route end node preparing system of the present invention has an input section 1, an input control section 2, a route end node series preparing section 3, node data 4, intersection data 5, road data 6, a route search processing section 7, a node series and intersection series preparing section 8, intersection series and node series data 9, and a navigation section 10. In the input section 1, a starting point and a destination, as well as data instructions such as instructions to start navigation, are input through display touching or key manipulation. The information input at the input section 1 is decoded at the input control section 2 for the purpose of controlling the execution of route search or navigation. In setting a course, input control section 2 transmits the information regarding the starting point or the destination to the route end node preparing section 3 and the route search processing section 7 so as to control them. When executing navigation, input control section 2 controls the navigation section 10. The navigation section 10 represents the principal part of the navigation apparatus and is equipped with data processing means, display means and audio output means. During travel, the navigation section 7 outputs the intersection series and node series data 9 of the optimum set course.

Figure 2A:
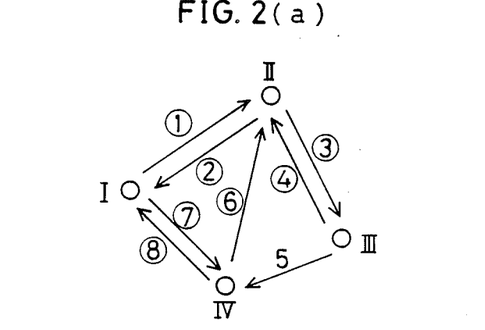
FIG. 2(a) is a diagram of a road system.
Figure 2B:
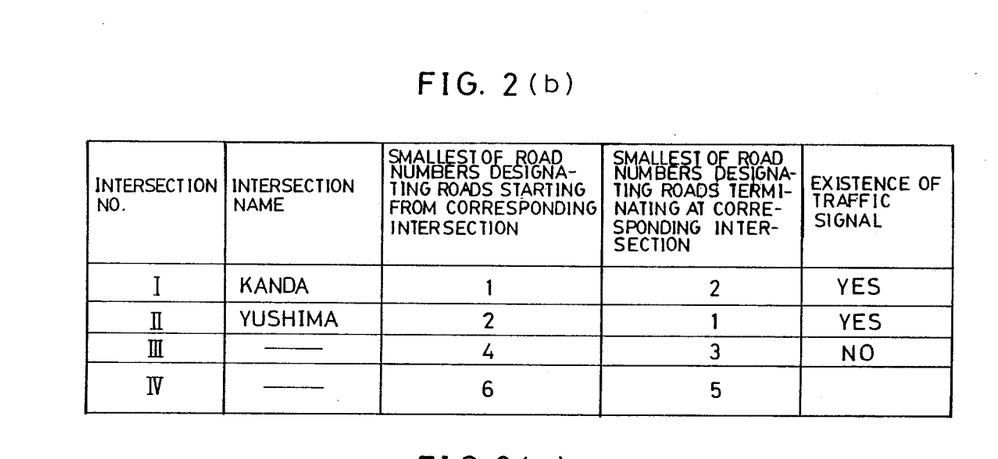
FIGS. 2(b) to 2(d) are tables of intersection data, road data and node series data.
Figure 2C:
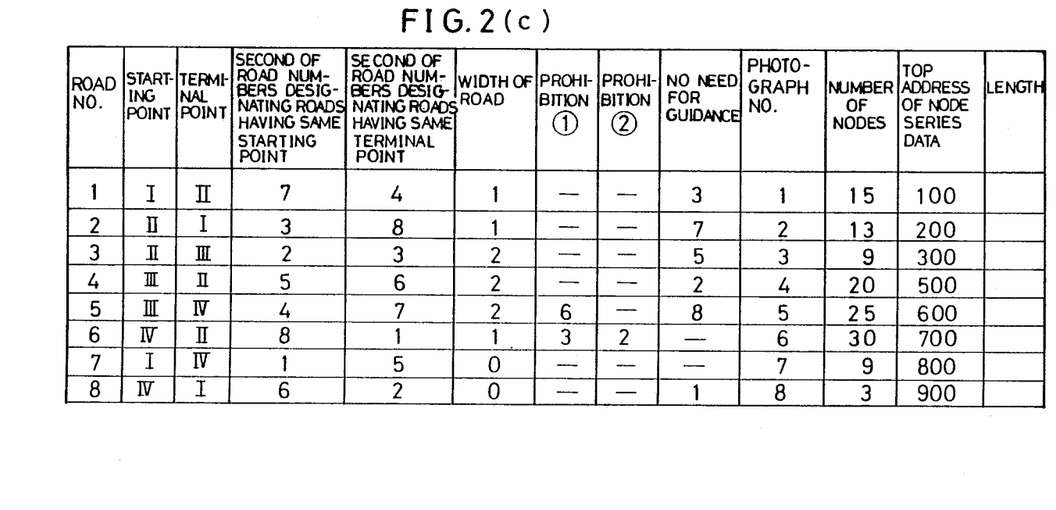
Figure 2D:
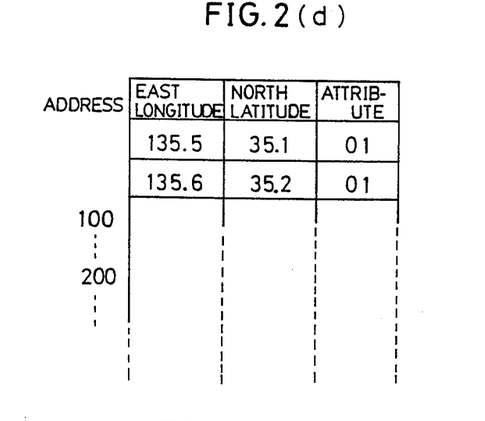

As shown in FIG. 2(d), the node data 4 is composed of positional information and attribute information with respect to the roads. The intersection data 5 is composed of information about intersections, as shown in FIG. 2(b), and the road data 6 is composed of information regarding inter-road connection and road characteristics, as shown in FIG. 2(c).

For a road network represented by intersection numbers I to IV and road numbers ① to ⑧, as shown in FIG. 2(a), the present invention can provide a road network data, which includes groups of data items, such as the following: intersection data items as shown in FIG. 2(b); road data items as shown in FIG. 2(c); and node data items as shown in FIG. 2(d).

For example, FIG. 2(b) shows intersection data indexed by intersection numbers I to IV, which includes intersection names, numbers which represent the smallest road number starting from each of the intersections I to IV, numbers which represent the smallest road number terminating at each of intersections I to IV, and values each representing existence or absence of traffic signals.

FIG. 2(c) shows, for example, road data indexed by road numbers ① to ⑧, which includes starting and terminal points represented by intersection numbers I to IV, numbers which represent the number of another (or a second) road having the same starting point for each road number ① to ⑧, numbers which represent the number of another (or a second) road having the same terminal point for each road number ① to ⑧, the widths of the roads, prohibition information, free-of-guidance information, photograph numbers, the numbers of nodes, the top address of node series data for each road, and the lengths of the roads.

In the road data, each road can be expressed by a sequence of nodes (node series), in which a plurality of nodes are interconnected between two successive intersections (i.e., intersections I and II) along a road. The node number included in the road data, as shown in FIG. 2(c), represents the number of nodes contained along the road between the intersections. For example, in FIG. 2(c), the road number ① it has 15 nodes connected in a series starting from the address of 100 of the node series data, i.e. 100→102→103 . . . 114. Therefore, both ends of the road are defined by intersections, one of which is the starting point and the other of which is the goal or terminal point, and these intersections are interconnected by a sequence of nodes leading from one intersection to the other intersection.

It is assumed that between ordinary intersections there are two one-way roads of opposite direction. For a one-way road, it is assumed that the road between successive intersections only has one road running in one direction. For example, in the case of road ① as shown in FIG. 2(a), the intersection I is the starting point of this road. Therefore, the number of another (or a second) road having the same starting point is a road ⑦ which also starts at the intersection I. The intersection II is the terminal point of road ①. Therefore, the numbers of other (or second) roads having the same terminal point include road numbers ④ and ⑥.

The node data includes coordinate information, such as east longitudes and north latitudes and attribute information as shown in FIG. 2(d). As is apparent from the road data, the road unit indicated by each road number is defined by a plurality of nodes. That is, the node data relates to points on the roads. If something connecting a pair of nodes is called an arc, a road can be expressed by connecting, with an arc, each of adjacent pairs of nodes constituting a series of a plurality of nodes. For example, with respect to road number ①, the number of nodes is 15 and the top address of the corresponding node data items is 100. The road number ① therefore designates a series of fifteen nodes represented by node data items with addresses 100 to 114.

On the basis of the above-described network data, with respect to a course starting from, for example, intersection number I, a road number ① is first found from starting point information of the intersection data, and road number ⑦ is then found as another (or second) road number having same starting point from the road data. Conversely, from the corresponding information relating to road number ⑦, road number ① is found, thereby determining that there are no connecting roads represented by other road numbers. Data items relating to terminal points can be read out in a similar manner. With respect to the road number ⑤ in the road data, a prohibition with respect to the road number ⑥ is designated. Accordingly, in the network shown in FIG. 2(a), travel along a course indicated by the road numbers ⑤ and ⑥ (i.e., ⑤→⑥) through the intersection indicated by the intersection number IV is prohibited due to the existence of no-left/right-turn inhibition. Only travel along a course indicated by the road number ⑧ is allowed. In practice, there is no need for guidance in the direction of road number ⑧. Thus, the road data has road numbers designating entrance prohibition such as no-left/right-turn as well as road numbers designating cases where there is no need for guidance, thereby enabling a reduction in the information memory capacity and facilitating route searching.

Figure 3:
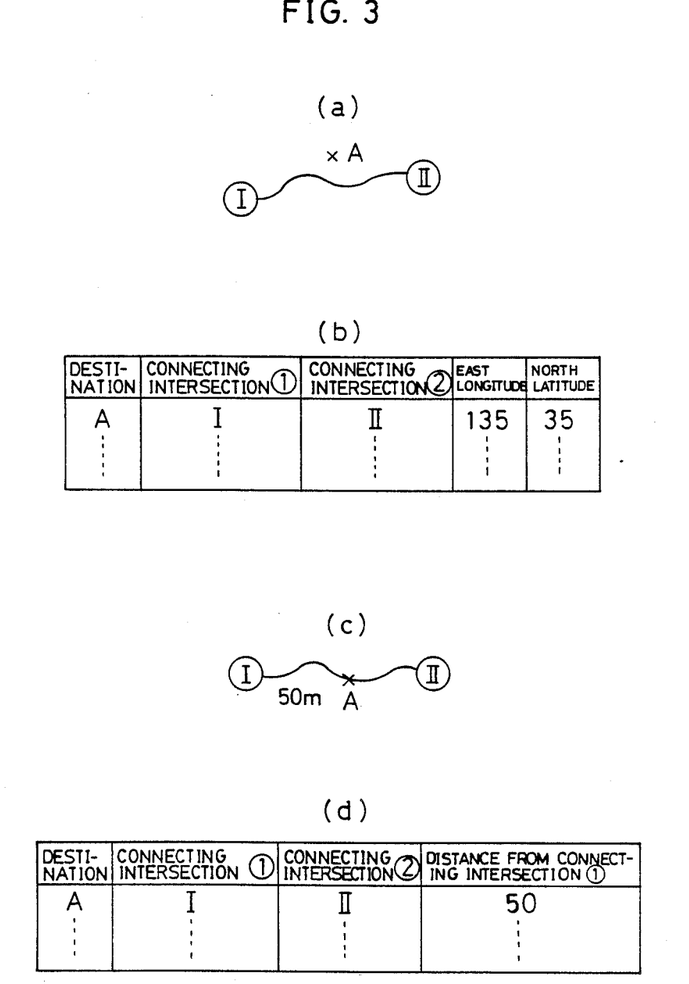
FIGS. 3(a) to 3(d) show examples of destination setting and the data therefor.

The route end node series preparing section 3 serves to prepare a sequence of nodes leading respectively from a starting point and a destination to a respective nearest intersection. It determines a nearest node series by successively performing node searching from the nearest intersection to the node which is closesest to the positional information corresponding to starting point or destination. FIG. 3 shows the case where the destination is set between intersections. When, for example, the destination A is input and set between the intersections I and II through coordinate specification which is not directly related to the road therebetween, as shown in FIG. 3 (a), the destination data in this case can be expressed as: connecting intersections I, II, 135 degrees of east longitude and 35 degrees of north latitude. When as shown in FIG. 3(b), the destination A is input and set between the intersections I and II along a road therebetween, with the distance from one of the intersections being specified, the destination data can be specified as: connecting intersections I, II, 50 m from the connecting intersection I. Accordingly, a sequence of nodes between the connecting intersection to this destination A or a sequence of nodes between the connecting intersection and the nearest node can be provided.

The route search processing section 7 is equipped with a connecting road search subroutine for finding connecting roads from an intersection, which excludes prohibited roads such as those in which turning to the right or left is prohibited; an optimum route condition setting subroutine for setting the conditions required for calculating an optimum route such as the road width, whether guidance is needed or not; and termination condition subroutine for judging route search termination. This route search processing section 7 performs the search of an optimum route of intersections from the intersections nearest the specified starting point to the destination. The intersection series and node series preparing section 8 serves to prepare the data on the a sequence of nodes between the intersections which are nearest to the starting point and the destination along the optimum route found out by the route search processing section 7. Thereafter, the intersection series and node series preparing section 8 combines the prepared sequence of nodes between intersections with sequences of nodes leading respectively from the starting point and the destination to the respective nearest intersection, which was prepared by the the data thus prepared are the node series prepared by the route end node series preparing section 3, thus preparing the intersection series and node series data 9, which includes a series of nodes between the starting point and destination.

Figure 4:
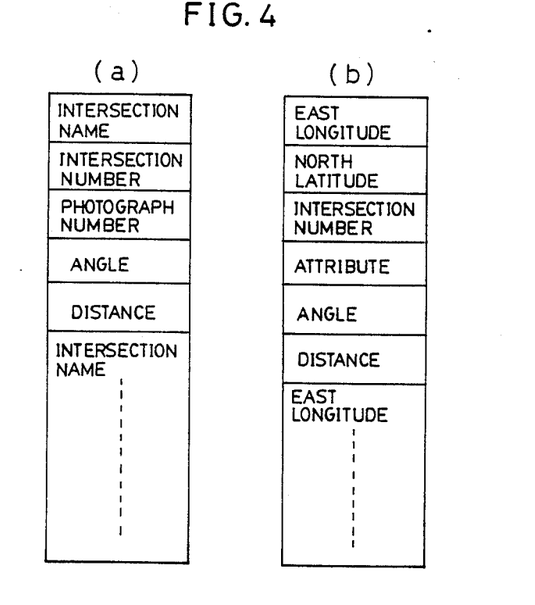
FIGS. 4(a) and 4(b) show examples of intersection series data and node series data.

As example of which this data includes the series of nodes is shown in FIG. 4. On the basis of this intersection series and node series data, the navigation section 10 performs navigation.

FIG. 5 illustrates the process conducted by the route end node series preparing section 3 for finding a node nearest the starting point and a node nearest the destination, such as destination A between intersections I or II as shown in FIG. 3.

It is examined first whether or not the destination setting is specified in coordinates as shown in FIG. 3(b). When the result is affirmative, the coordinate specifying operation below is conducted. When the result is negative, it means that the destination setting is distance-specified, so the distance specification processing below is to be effected.

Figure 5A:
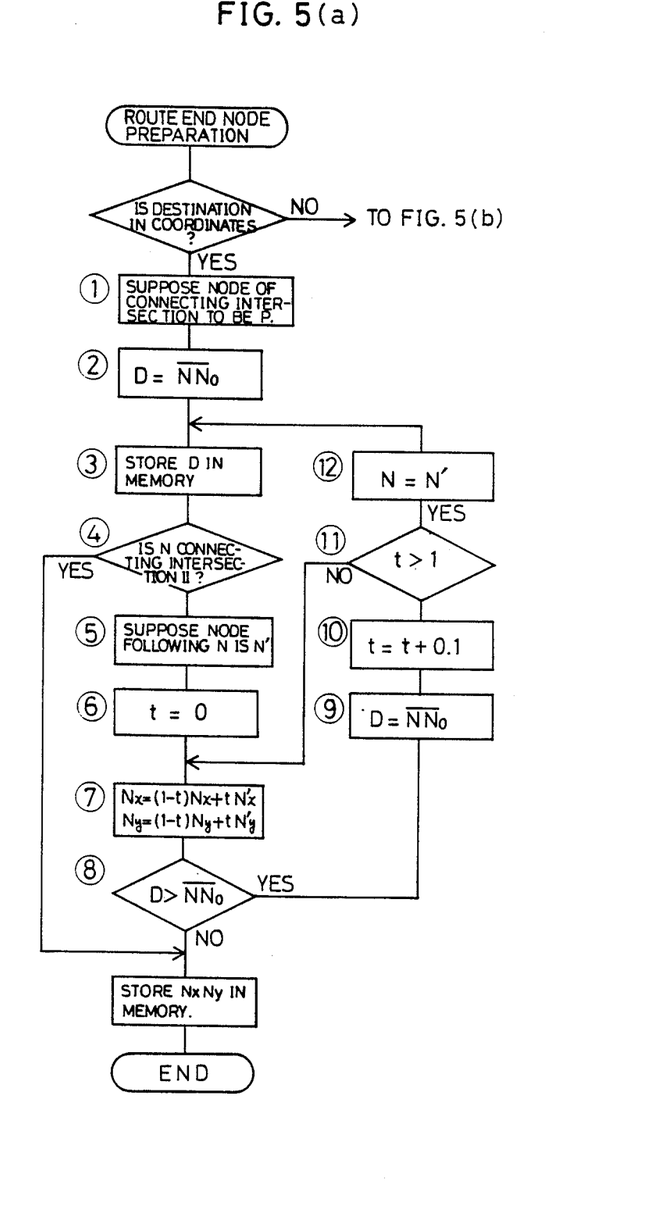
FIGS. 5(a) and 5(b) show a flow chart illustrating the operation of preparing a route end node series.

(A) Coordinate specification processing; FIG. 5(a)

① The node of the connecting intersection I is set as N.

② The node of the destination is set as No and the linear distance between the connecting intersection I and the destination D=NNo is calculated for storage in memory.

③ The distance D is stored in the memory.

④ It is examined whether or not the node N is the connecting intersection II.

When the result is affirmative, it means that the destination coincides with the connecting intersection II, so the process is ended by storing the node N in the memory. This cannot happen in the initial processing. It only occurs when the procesures ③ through ⑫ are repeated for the nodes up to the connecting intersection II, without attaining the termination conditions. When the result is negative, the following procesure ⑤ is performed.

⑤ The node following the node N is set as N'.

⑥ The partition constant t is set as 0.

⑦ The following equations are set regarding the cooridates $N_x$, $N_y$ of the node N:

$$N_x = (1-t)N_x + tN_x'$$

$$N_y = (1-t)N_y + tN_y'$$

⑧ It is examined whether or not the distance D is greater than the distance NN0 in coordinates obtained through the procedure ⑦, i.e., the distance from the point obtained by dividing the section between the nodes N and N' by the partition constant t to the node N0 of the destination.

If the result is affirmative, the following procedure ⑨ is performed. Since the result implies that the present point is nearer to the destination than the previous one, the point is further shifted. When the result is negative, it implies that the present point is farther from the destination than the previous one. Accordingly, the section between the node N and the next node N' at this time is nearest to the destination. Consequently, the sequence of nodes may be prepared from this section to the connecting intersection.

⑨ The distance D is replaced by NN0.

⑩ The partition constant t is added to by 0.1, i.e., the partition point is shifted by 10%.

⑪ It is examined whether or not the partition constant t has exceeded 1.

When the result is affirmative, the following procedure ⑫ is performed. The node N is then replaced by the next node N' and the procedure ③ is repeated. The affirmative result implies that the partition point has moved from the node N to the next node N' by being shifted by 0.1. Accordingly, the node is shifted by 1 in the procedure ⑫. When the result is negative, the procedure ⑦ is repeated. Since in this case the partition point is between the node N and the next node N', the procedures ⑦ and thereafter are repeated.

Figure 5B:
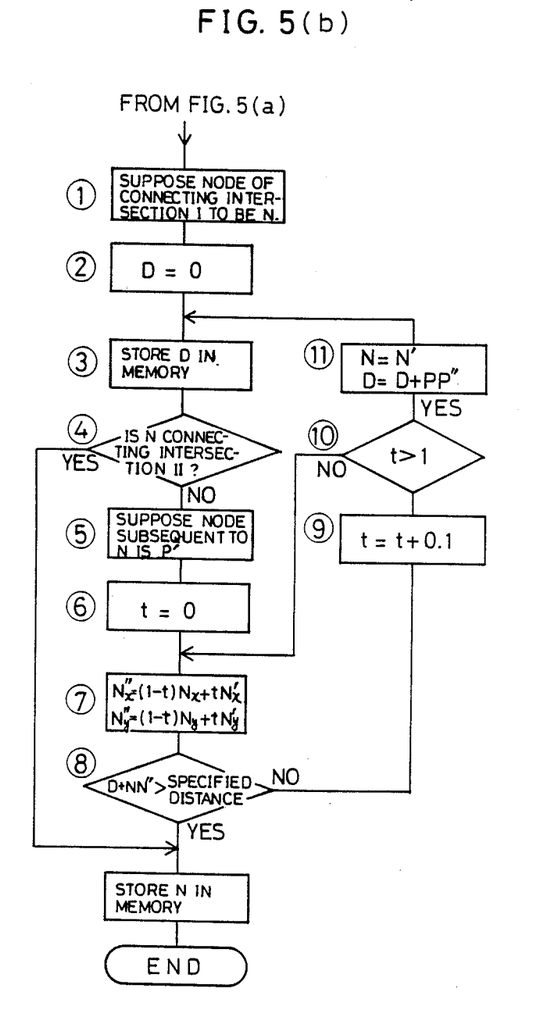

(B) Distance specification processing; FIG. 5(b)

① The node of the connecting intersection I is set as N.

② The distance D is set as 0.

③ The distance D is stored in the memory.

④ It is examined whether or not the node N is the connecting intersection II.

When the result is affirmative, the node N of the connecting intersection II is stored in the memory to end the processing. When the result is negative, the following procedure ⑤ is performed.

⑤ The node following the node N is set as N'.

⑥ The partition constant is set as 0.

⑦ The following equations are set regarding the cooridates $N_x''$, $N_y''$ of the partition point by the partition position constant t:

$$N_x'' = (1-t)N_x + tN_x'$$

$$N_y'' = (1-t)N_y + tN_y'$$

⑧ It is examined whether or not the distance obtained by adding the distance NN" to the point N" of the coordinates $N_x''$, $N_y''$ calculated in the procedure 7 to the distance D is greater than the distance from the destination input to the connecting intersection I.

If the result is affirmative, the coordinates $N_x$, $N_y$ are stored in the memory to end the procedure. The affirmative result implies in this case that the present point is situated farther from the destination than the previous one, so that the section between node N at this time and the next node N' is nearest to the destination. Accordingly, the sequence of nodes may be prepared from this section to the connecting intersection. If the result is negative, the following procedure ⑨ is performed. Since the negative result in this case implies that the present point is nearer to the destination than the previous one, the point is further shifted.

⑨ The partition constant t is added to by 0.1, i.e., the partition point is shifted by 10%.

⑩ It is examined whether or not the partition constant t has exceeded 1.

When the result is affirmative, the following procedure ⑪ is performed. The node N is then replaced by the next node N'. Further, the distance NN" is added to the distance D. The former D is replaced by the sum obtained, and then the procedure ③ is repeated. The affirmative result implies that the partition point has moved from the node N to the next node N' by being shifted by 0.1. Accordingly, the node is shifted by 1 in the procedure ⑪. When the result is negative, the procedure ⑦ is repeated. Since in this case the partition point is between the node N and the next node N', the procedures ⑦ and thereafter are repeated.

The flow of route search processing based on the above-described network data will be described below with reference to FIG. 6. In the flow chart of FIG. 6, c represents the intersection number; L(c), the distance; F(c), flag; R(c), a road number designating a traveled road; s0 and s1, intersection numbers designating intersections adjacent to a starting point; and e0 and e1, intersection numbers designating intersections adjacent to a destination. F(c)=0 indicates the unsearched state, F(c)=1 indicates searching, and F(c)=2 indicates completion of searching.

① With respect to all intersections distance L(c) is set to infinite ($\infty$), and flag F(c) is set to "0" (unsearched state).

The initialization is thus performed, so that all the intersections are regarded as unsearched and the distance between the starting point and each intersections as infinite.

② The distance from the starting point are substituted for distances L(s0) and L(s1) corresponding to intersection numbers s0 and s1 adjacent to the starting point, flags F(s0) and F(s1) corresponding to intersection numbers s0 and s1 adjacent to the starting point are set to "1", and the road number indicating the route from the starting point is set as the road number designating the passed route is set to t.

③ Intersection numbers are searched to find intersection number c0 which satisfies the condition that flag F is not "2" and the distance L(c) is minimum.

④ The connecting road search subroutine is executed to search connecting roads starting from intersection number c0.

⑤ Whether or not there is any connecting road is examined.

In the case of YES, the process proceeds to the next step ⑥. In the case of NO, the process proceeds to step 11.

⑥ The optimum route condition setting subroutine is executed to set road circumstances and other conditions for searching for the optimum road.

⑦ The intersection number corresponding to the terminal end of the present road is set to c1 and the length of the road is set as l.

⑧ The distance P to the terminal end of the present road is calculated:

$$P = L(c0) + l$$

where L(c0) is the distance between the starting point and the intersection and L is the distance from the intersection number (c0). L is obtained as the distance through which the terminal end of the road (examined for searching) corresponding to the intersection number c1 is reached via the same road.

⑨ Whether or not the condition that P<L (c1) and F(c1)≠2 is satisfied is examined.

In the case of YES, the process proceeds to the next step ⑩. In the case of NO, the process returns to step ④.

⑩ The distance between the starting point and the intersection corresponding to intersection number c1 is set to P, corresponding flag F(c1) is set to "1", and road number R(c1) indicating the route traveled until the intersection corresponding to intersection number C1 is reached is set as the road number of the route examined for searching.

⑪ If NO in step ⑤, F(c0) is set to "2".

⑫ The completion condition confirmation subroutine is executed.

⑬ Whether or not the processing has been completed is examined. In the case of NO, the process proceeds to step 3. In the case of YES, the processing is ended.

As a result of this processing, with respect to each intersection number, the road number indicating the optimum course from the starting point to the intersection corresponding to each intersection number is set.

Figure 7:
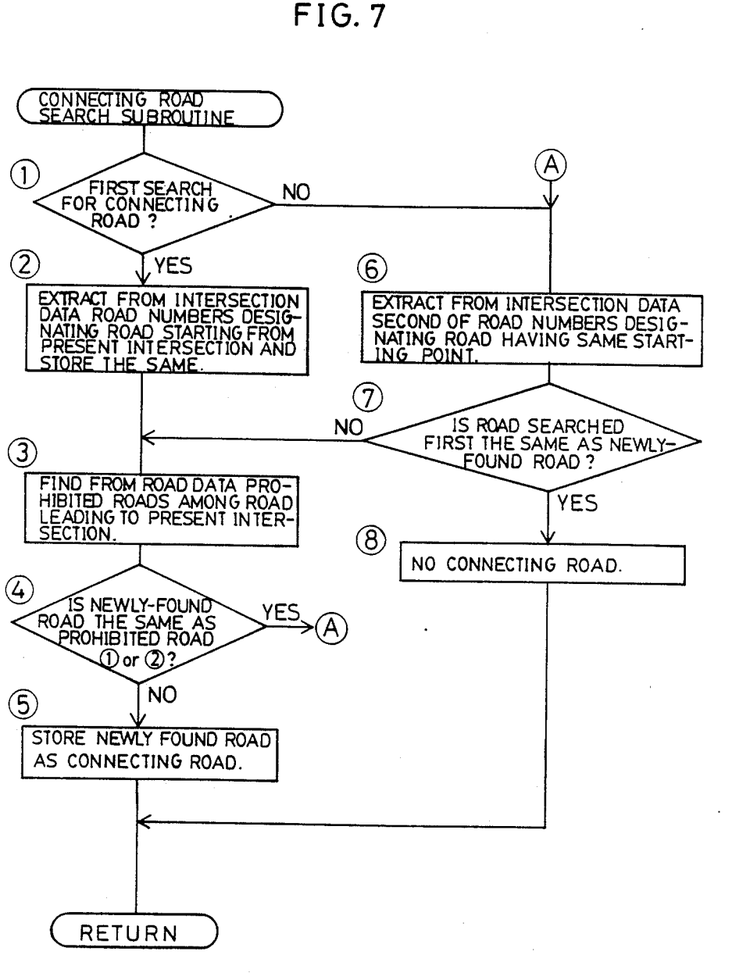
FIG. 7 is a flow chart of connecting road search subroutine.

The connecting road search subroutine in step ④ is conducted in accordance with the flow shown in FIG. 7, as described below.

① Whether or not the present searching is initial searching is examined.

In the case of YES, the process proceeds to step ②. In the case of NO, the process proceeds to step ⑥.

② A road number indicating a route starting from the present intersection c0 is extracted from the intersection data shown in FIG. 2(b) and is stored.

③ A road number indicating a prohibited road connected to the intersection c0 examined for searching is read out from the data shown in FIG. 2(c).

④ Whether or not the newly-extracted road corresponds to the prohibited road is examined. In the case of YES, the process proceeds to step ⑥. In the case of NO, the process proceeds to step ⑤.

⑤ The newly-extracted road is stored as a connecting road and the process returns (to step 5 of FIG. 3(a)).

⑥ A road number which indicates a road having the road previously found and which is next to the road number indicating the previously-found road is extracted from the road data.

⑦ Whether or not the previously-found road and the newly-extracted road are the same is examined.

In the case of YES, the process proceeds to the next step ⑧. In the case of NO, the process returns to step ③.

⑧ A determination that there is no connecting road is made and then the process returns.

Figure 6:
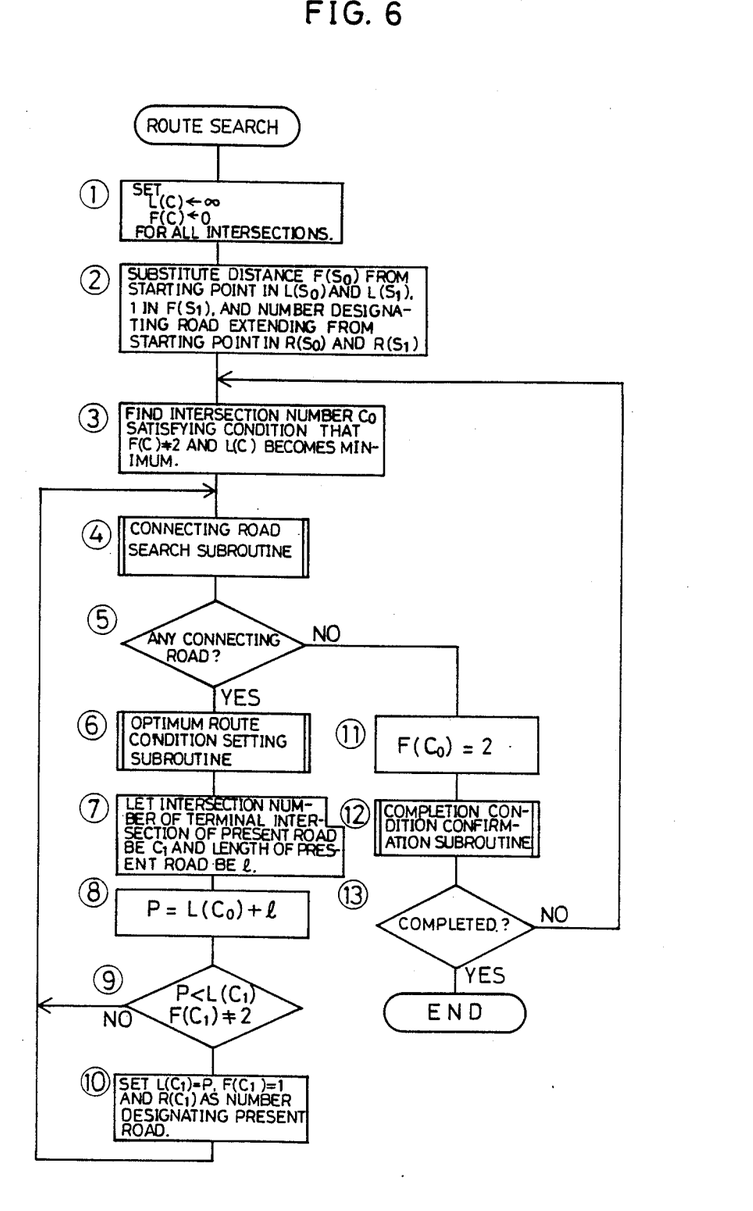
FIG. 6 is a flow chart of route search processing.
Figure 8:
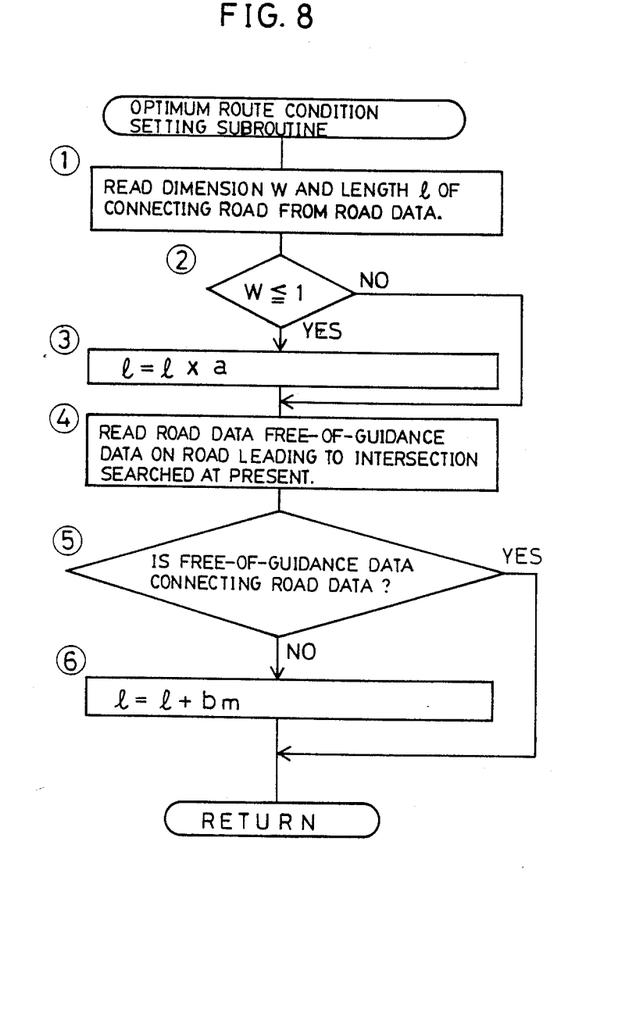
FIG. 8 is a flow chart of optimum course condition setting subroutine.

The optimum route condition setting subroutine in step ⑥ of FIG. 6 is conducted in accordance with the flow such as that shown in FIG. 8, as described below.

① The dimension W and the length l of each connecting road are read from the road data.

② Whether or not the dimension W of each connecting road is equal to or smaller than 1 is examined.

In the case of YES, the process proceeds to step ③. In the case of NO, the process proceeds to step ④.

③ The value of l is multiplied by a. That is, if a road having a dimension larger than 1 is regarded as an ordinary wide road while a road having a dimension equal to or smaller than 1 is regarded as a narrow road, the narrow road is rated at a value in terms of distance a times higher than that of the wide road. The number a is therefore larger than 1.

④ Free-of-guidance data relating to the road traveled to the intersection presently examined for searching is read from the road data.

⑤ Whether or not there is any connecting road in correspondence with the free-of-guidance data is examined.

In the case of YES, the process returns. In the case of NO, the process proceeds to step ⑥.

⑥ $b_m$ is added to 1 to set another new value of l, and the process returns. That is, an intersection at which guidance for, for example, left or right turn is required is rated at a value larger than the guidance-free intersection by b in terms of distance.

Figure 9:
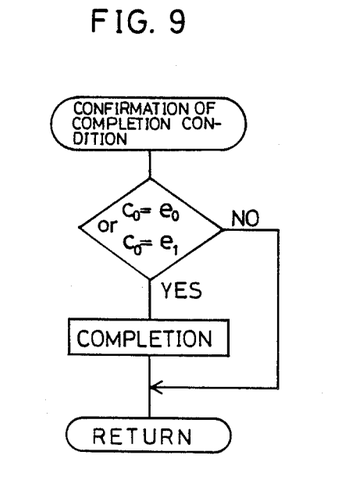
FIG. 9 is a fow chart of completion condition confirmation subroutine.
Figure 10:
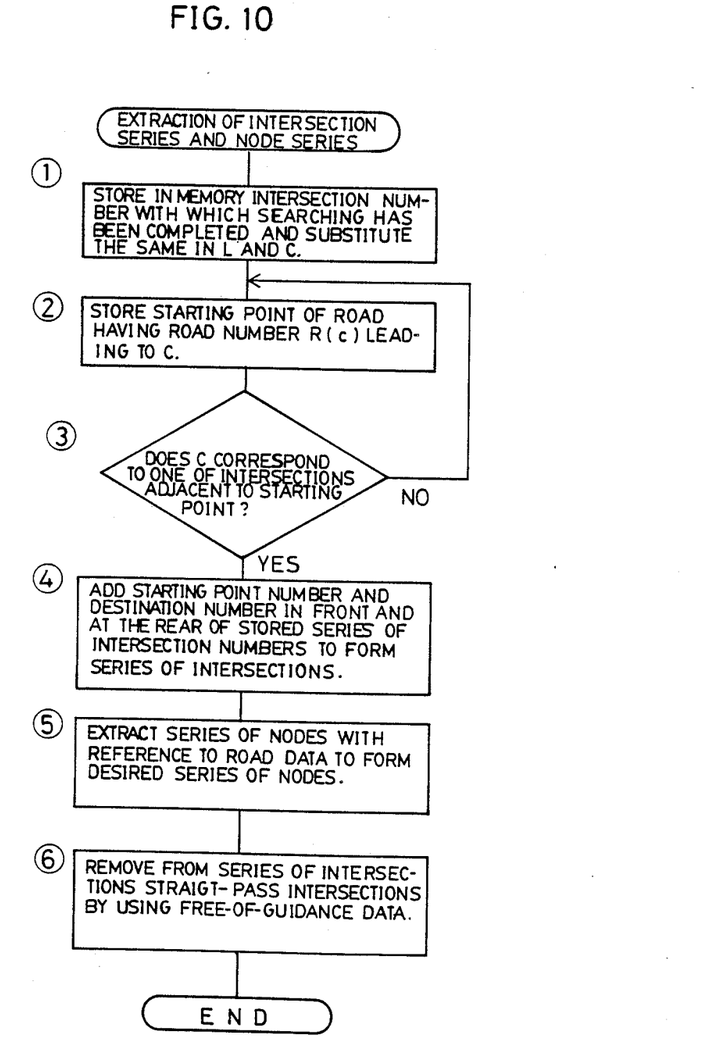
FIG. 10 is a flow chart of processing of extracting a series of intersections and a series of nodes.

In the completion condition confirmation subroutine, as shown in FIG. 9, whether or not intersection number c0 indicating the intersection examined for searching and one of the intersection numbers indicating adjacent intersections of the destination coincide with each other is examined, and a completion flag, for example, is set on condition that coincidence is found.

As described above, in the route searching in accordance with the present invention, the distance between intersections is weighed in consideration of the dimension of the connecting road and travel conditions relating to the need for guidance, thus searching for the shortest route. As a result, items of road number information in coincidence with the optimum course can be obtained with respect to the intersections. It is therefore possible to prepare data on a series of intersections between an intersection respectively nearest a starting point and destination and series of nodes therebetween in accordance with the processing flow of FIG. 7 on the basis of the results of searching, as described below.

① The intersection number indicating one of the intersections which has been examined for searching is stored in the memory.

② The starting end of the road extending from that intersection is stored in the memory.

③ Whether or not the intersection coincides with one of the intersections adjacent to the starting point is examined.

In the case of YES, the process proceeds to the next step ④. In the case of NO, the process returns to step ②.

④ A starting number and a destination number are placed in front and at the rear of the stored series of intersection numbers, thereby forming a series of intersections.

⑤ Nodes between intersections from the intersection nearest the starting point to the intersection nearest the destination point is extracted from the road data to form the node series. For example, when road number ① between intersections I and II is found by route retrieval, the 15 nodes between intersections I and II along road ① is extracted or retrieved, namely, those beginning with the address 100, as shown in FIG. 2(c).

⑥ Guidance-free intersections are removed from the series of intersections by using the free-of-guidance data.

FIG. 4 shows examples of items of data on the series of intersections and the series of nodes obtained as described above. As shown in FIG. 4(a), the intersection series data is constituted by various items including intersection names, intersection numbers, photograph numbers indicating photographs of specific views of intersections, turning angles and distances. Thus, intersection series data includes only data of intersections which require guidance, and does not iclude intersections which require no guidance. During operation, it is sufficient only to successively read these items of data and output the read data in accordance with predetermined positions. As shown in FIG. 4 (b), the node series information is constituted by east longitudes and north latitudes representing the positions of nodes, intersection numbers, attributes, angles and distances. This node series starts with the node closest to the starting point and ends with a node closest to the destination and is used for providing guiding information, such as a display of the route, display of thd position on the route, etc.

As described above, searching is conducted while the left/right turn prohibition data is checked, thereby searching for courses which include no section where the driver is stopped from traveling by left or right turn prohibition.

The present invention should not be construed as restricted to the above embodiment. Various modifications are possible within the scope of invention. For example, while in the above embodiment the navigation course is prepared from data series composed of a node series and an intersection series, only one of the two types of series, i.e., either a node series or an intersection series will serve the purpose of performing navigation. When only an intersection series is employed, it goes without saying that the respective data in the intersection series are equipped with necessary information such as photographs for navigation or guidance information. Further, when performing navigation using intersection series data, navigation can be conducted by a simple operation by providing push-button switches. The driver may then manipulate the push-button switches each time he passes an intersection to read out the data on the next intersection.

While in the above embodiment the route search is started at a starting point, it may also be started at a destination. Further, while in the above embodiment the route search is terminated when the destination is reached, it may be continued until all the flags F (c) become 2, i.e., it may be continued for all the intersections. In particular, when the route search is started at the destination, optimum course information leading to the destination can be prepared for all the intersections, so that even if the driver gets out of his course on the way, he can prepare an intersection series and a node series from the nearest intersection without having to perform the route search again.

As will be appreciated from the above description, in the system in accordance with this invention, a node series leading to the point nearest to the starting point or the destination is prepared at a particular point such as can intersection, without inputting the starting point or the destination, so that the driver can recognize his position and be guided through the route from the starting point to the destination. Accordingly, an arbitrary point can be set as a starting point or a destination, based upon the information on the distance from the destination to the connecting intersection, the coordinates of the area around the connecting intersection or the like, which makes it possible to conduct perfect course guidance from the starting point to the destination. Furthermore, the intersection data, the road data and the node data are previously stored in memory means such as a CD-ROM, the route search being performed while making sure at each intersection whether or not turning is inhibited, based upon the data read out onto an RAM or the like prior the route search, whereby the route search is expedited compared to conventional systems. In addition, since the turning inhibition data is contained in the road data, the amount of data, and consequently, the memory capacity, can be smaller. Furthermore, since there is provided guidance-free data, in accordance with which it is judged whether to go straight or turn to the right or left, the search for th eleast-time-consuming route can be performed with data in a smaller amount. Further, it becomes easier to recognize the go-straight intersections from the guidance-free data and remove them from the intersection node in order to prepare intersection data containing turning intersections only.

What we claim is:

1. A navigation apparatus comprising:
   an intersection database including information about intersections;
   a road database including information about roads;
   a node database including information about nodes, said nodes representing points along said roads between said intersections;
   starting point input means for inputting a starting point;
   destination input means for inputting a destination;
   nearest intersection detecting means for detecting a starting intersection nearest to said starting point and a destination intersection nearest to said destination;
   route end node searching means for retrieving from said node database a starting node nearest said input starting point and a destination node nearest said input destination, providing a starting sequence of nodes between said starting node and said starting intersection, and providing a destination sequence of nodes between said destination node and said destination intersection;
   route retrieving means for retrieving a route between said starting intersection and said destination intersection based upon the information about said intersections and said roads;
   intersections node sequence forming means for forming an intersection sequence of nodes between said starting intersection and said destination intersection based upon said retrieved route; and
   node series forming means for providing a series of nodes between said input starting point and said input destination by combining said intersection sequence of nodes with said starting sequence of nodes and said destination sequence of nodes.

2. A navigation apparatus according to claim 1, wherein said route end node searching means extracts two nodes adjacent to said input starting point and a position between said two extracted nodes is used as said input starting point, and said route end node searching means extracts another two nodes adjacent to said input destination and a position between said another two extracted nodes is used as said input destination.

3. A navigation apparatus comprising:
   input means for inputting a starting point and destination;
   memory means having an intersection database, a road database, and a node database, said intersection database including information about intersections within a road network, said road database including information about roads between said intersections, and said node database including information about nodes corresponding to points along said roads between sais intersections;
   navigation means for outputting information about a series of nodes between an input starting point and destination; and
   control means for receiving said input starting point and destination and providing said series of nodes to said navigation means; said control means including:
   (a) nearest intersection detecting means for detecting a starting intersection nearest to said input starting point and a destination intersection nearest to said input destination;
   (b) route end node searching means for retrieving from said node database a starting node nearest said input starting point and a destination node nearesft said input destination, providing a starting sequence of nodes between said starting node and said starting intersection, and providing a destination sequence of nodes between said destination node and said destination intersection;

(c) route retrieving means for retrieving a route between said starting intersectiona and said destination intersection based upon the information about said intersections and said roads;

(d) intersection node sequence forming means for forming an intersection sequence of nodes between said starting intersection and said destination intersection based upon said retrieved route; and (e) node series forming means for providing said series of nodes between said input starting point and said input destination by combining said intersection sequence of nodes with said starting sequence of nodes and said destination sequence of nodes.

4. A navigation apparatus according to claim 3, wherein said route end node searching means includes means for extracting two nodes adjacent to said input point, using a position between said two extracted nodes as said input starting point, extracting another two nodes adjacent to said input destination, and using a position between said another two extracted nodes as said input destination.

* * * * *